United States Patent
Ogasawara et al.

(10) Patent No.: US 9,257,301 B2
(45) Date of Patent: Feb. 9, 2016

(54) METHOD OF ETCHING SILICON OXIDE FILM

(71) Applicant: TOKYO ELECTRON LIMITED, Tokyo (JP)

(72) Inventors: Masahiro Ogasawara, Miyagi (JP); Masafumi Urakawa, Miyagi (JP); Yoshinobu Hayakawa, Miyagi (JP); Kazuhiro Kubota, Miyagi (JP); Hikaru Watanabe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/462,658

(22) Filed: Aug. 19, 2014

(65) Prior Publication Data
US 2015/0056808 A1 Feb. 26, 2015

(30) Foreign Application Priority Data
Aug. 20, 2013 (JP) .................................. 2013-170218

(51) Int. Cl.
*H01L 21/302* (2006.01)
*H01L 21/311* (2006.01)
*H01L 21/3213* (2006.01)
*H01J 37/32* (2006.01)

(52) U.S. Cl.
CPC .... *H01L 21/31144* (2013.01); *H01L 21/31116* (2013.01); *H01J 37/32091* (2013.01); *H01L 21/32136* (2013.01); *H01L 21/32137* (2013.01)

(58) Field of Classification Search
CPC .................. H01J 37/32091; H01L 21/32136; H01L 21/32137; H01L 21/31116; H01L 21/31144
USPC .............................. 438/690–694; 216/37, 67
See application file for complete search history.

(56) References Cited

U.S. PATENT DOCUMENTS

| | | | |
|---|---|---|---|
| 5,240,554 A * | 8/1993 | Hori et al. ...................... | 438/702 |
| 5,314,576 A * | 5/1994 | Kadomura ...................... | 216/67 |
| 6,191,045 B1 * | 2/2001 | Yoshigai et al. .............. | 438/714 |
| 7,977,390 B2 | 7/2011 | Ji et al. | |

FOREIGN PATENT DOCUMENTS

JP 2007-288119 A 11/2007

* cited by examiner

*Primary Examiner* — Nadine Norton
*Assistant Examiner* — Maki Angadi
(74) *Attorney, Agent, or Firm* — Rothwell, Figg, Ernst & Manbeck, P.C.

(57) ABSTRACT

Provided is a method of etching a silicon oxide film. The method includes exposing a workpiece including the silicon oxide film and a mask formed on the silicon oxide film to plasma of a processing gas to etch the silicon oxide film. The mask includes a first film formed on the silicon oxide film and a second film formed on the first film, and the second film is constituted by a film having an etching rate lower than that of the first film with respect to active species in the plasma.

14 Claims, 7 Drawing Sheets

FILM THICKNESS OF REMAINING FILM OF MASK
(nm)

FIG.7

METHOD OF ETCHING SILICON OXIDE FILM

CROSS-REFERENCE TO RELATED APPLICATIONS

This application is based on and claims priority from Japanese Patent Application Nos. 2013-170218 filed on Aug. 20, 2013 with the Japan Patent Office, the disclosure of which is incorporated herein in its entirety by reference.

TECHNICAL FIELD

The present disclosure relates to a method of etching a silicon oxide film.

BACKGROUND

In manufacturing semiconductor devices, etching may be performed to form features such as contact holes in a silicon oxide. Further, with miniaturization and high integration of the semiconductor devices, the aspect ratio of such a feature is increasing every year. That is, it is requested that finer and deeper features be formed in the silicon oxide film.

Japanese Patent Laid-Open Publication No. 2007-288119 discloses an example of a method for etching a silicon oxide film. The method for etching a silicon oxide film as described in the Japanese Laid-Open Publication No. 2007-288119 includes exposing a workpiece having a mask on the silicon oxide film to plasma of a processing gas such as, for example, a fluorocarbon gas so as to etch the silicon oxide film. In the method of Japanese Patent Laid-Open Publication No. 2007-288119, an amorphous carbon film is used as the mask.

In such etching of the silicon oxide film, a phenomenon that a side wall defining a hole foil led in the silicon oxide film expands partially transversely, but not vertically may occur. That is, a phenomenon that the width of the hole is increased partially may occur. Such a phenomenon is called "bowing", and its major factor is that ions or electrons contributing to etching are incident obliquely with respect to holes and collide with the side wall defining the hole. As a method for suppressing the bowing, U.S. Pat. No. 7,977,390 discloses a method for etching a silicon oxide film in which a polysilicon film is used as a mask, and a silicon-containing protective film is formed on a mask surface exposed to plasma, as well as on a side wall of the silicon oxide film which is a hole portion formed on a layer to be etched so as to etch the silicon oxide film while protecting a side wall of a hole from oblique incidence of ions.

SUMMARY

According to an aspect, the present disclosure provides a method of etching a silicon oxide film. The method includes exposing a workpiece including the silicon oxide film and a mask formed on the silicon oxide film to plasma of a processing gas to etch the silicon oxide film. The mask includes a first film formed on the silicon oxide film and a second film formed on the first film, and the second film is constituted by a film having an etching rate lower than that of the first film with respect to active species in the plasma.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Although the protective film is formed on the surface of the mask or the hole portion, the protective film disappears and the film thickness of the mask becomes thinner gradually as the etching of the silicon oxide film progresses. Further, as a film thickness of a hole becomes thinner, more ions of an obliquely incident component reach a deeper region of the hole. Therefore, the hole foiled in the silicon oxide film has a bowing profile.

Accordingly, in the related art, it becomes necessary to reduce bowing from a feature obtained by etching the silicon oxide film.

According to an aspect, the present disclosure provides a method of etching a silicon oxide film. The method includes exposing a workpiece including the silicon oxide film and a mask formed on the silicon oxide film to plasma of a processing gas to etch the silicon oxide film. The mask includes a first film formed on the silicon oxide film and a second film formed on the first film, and the second film is constituted by a film having an etching rate lower than that of the first film with respect to active species in the plasma.

The present inventors have found that, when the etching of the silicon oxide film progresses, the film thickness of the mask is reduced gradually, and when the film thickness of the mask is reduced, active species in plasma are incident obliquely with respect to a vertical direction from an opening of the mask and collide with the silicon oxide film just below the mask, such that the silicon oxide film is cut transversely just below the mask, thereby causing bowing.

Accordingly, in the above-described method according to the aspect, a mask including a first film and a second film is used as the mask. A film having an etching rate lower than that of the first film with respect to the active species in the plasma used in the etching of the silicon oxide film is used as the second film. In general, a film having a low etching rate with respect to the active species in the plasma used in the etching of silicon oxide film is made of a material hard to etch. Accordingly, when the film thickness of the film is increased, it is difficult to form a pattern on the film. Therefore, the method of the present disclosure realizes a mask having a resistance to active species in the plasma and a thick film thickness by using the mask including the first film and the second film. According to the method of the present disclosure, the film thickness of the mask may be maintained until the end of the etching of the silicon oxide film, and as a result, bowing of the feature obtained by the etching of the silicon oxide film may be reduced.

In an exemplary embodiment, the second film may have a film thickness which is smaller than that of the first film. According to this exemplary embodiment, a mask having a thick film thickness may be obtained by decreasing the film thickness of the second film which may be made of a material hard to etch and increasing the film thickness of the first film.

In an exemplary embodiment, the first film may be a polysilicon film. Further, in an exemplary embodiment, the second film may have an etching rate which is one third or less of the etching rate of the first film with respect to the active species in the plasma. Further, in the aspect, the second film may be a metal-containing film, for example, a tungsten film.

As described above, according to a positional aspect and various exemplary embodiments of the present disclosure, it is possible to reduce bowing of a feature obtained by etching the silicon oxide film.

Hereinafter, various exemplary embodiments of the present disclosure will be described in detail with reference to drawings. Meanwhile, in each drawing, the same or corresponding parts will be denoted by the same reference numerals.

A method according to an exemplary embodiment is a method of etching a silicon oxide film. The etching method includes exposing a workpiece (hereinafter, referred to as a "wafer") W including the silicon oxide film and a mask formed on the silicon oxide film to plasma of a processing gas to etch the silicon oxide film. Accordingly, the etching method of the exemplary embodiment forms a feature such as a hole in the silicon oxide film. Meanwhile, details of the mask used in the etching method will be described later.

Figure 1:
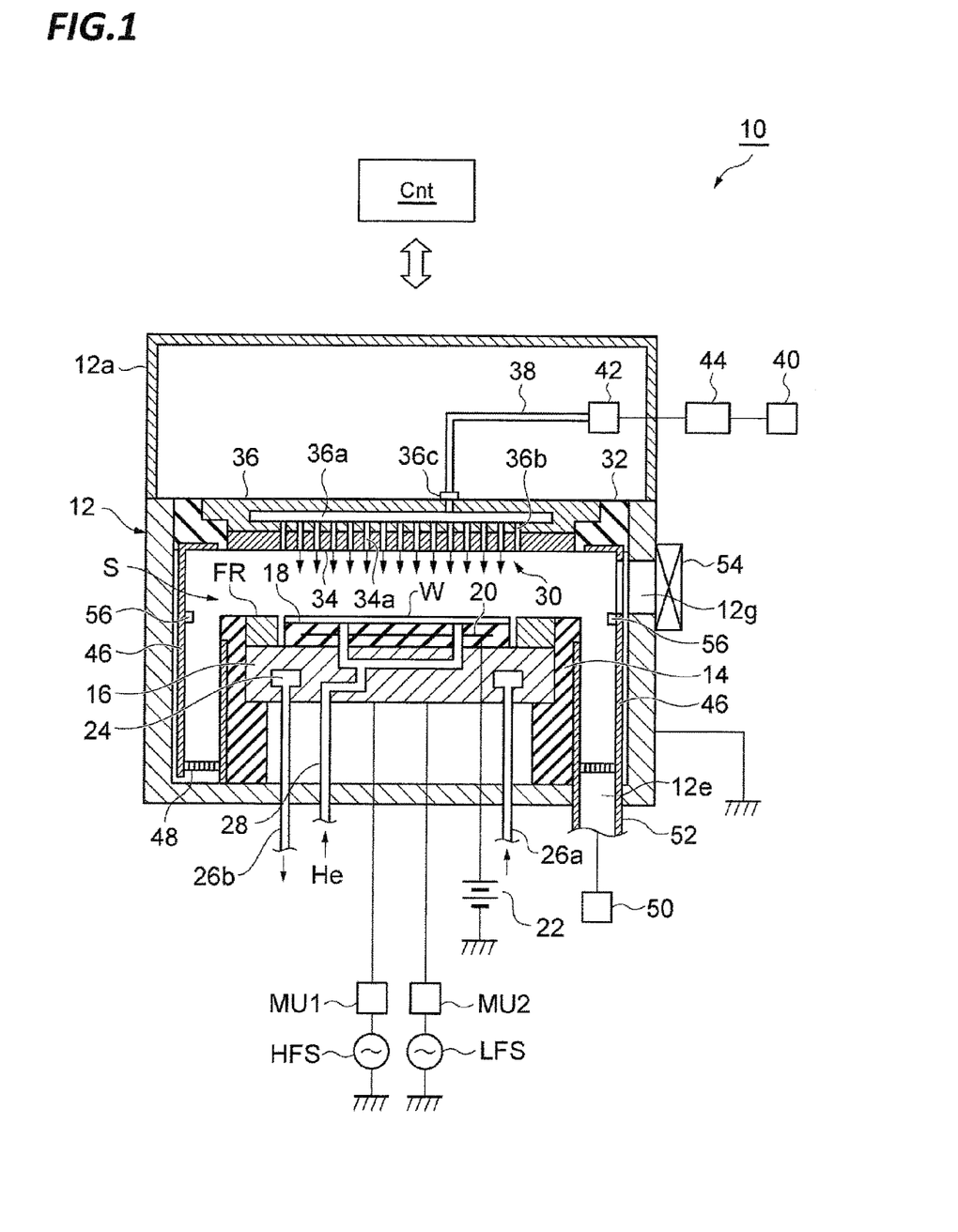
FIG. 1 is a view illustrating an exemplary plasma processing apparatus which can be used for performing an etching method according to an exemplary embodiment.

Hereinafter, description will be made on an exemplary plasma processing apparatus which can be used for performing an etching method. FIG. 1 is a view illustrating an exemplary plasma processing apparatus which can be used for perform an etching method according to an exemplary embodiment. FIG. 1 schematically illustrates a vertical-section of a plasma processing apparatus 10.

The plasma processing apparatus 10 as illustrated in FIG. 1 is a capacitively coupled parallel-plate plasma etching apparatus, and is provided with a substantially cylindrical processing container 12. The processing container 12 has a surface made of, for example, an anodized aluminum. The processing container 12 is grounded for safety.

A cylindrical support 14 made of an insulating material is disposed on the bottom of the processing apparatus 12. The support 14 supports a lower electrode 16 on its inner wall. The lower electrode 16 is made of a metal such as, for example, aluminum, and has substantially a disc shape.

The lower electrode 16 is connected with a first high frequency power source HFS through a matching unit MU1. The first high frequency power source HFS is a power source configured to generate a high frequency power for plasma generation, and generates a high frequency power of 27 MHz to 100 MHz, for example, 40 MHz. The matching unit MU1 has a circuit configured to match an output impedance of the first high frequency power source HFS and an input impedance of a load side (lower electrode 16 side).

Further, the lower electrode 16 is connected with a second high frequency power source LFS through a matching unit MU2. The second high frequency power LFS source generates a high frequency power (high frequency bias power) for drawing electrons to the wafer W, and supplies the high frequency bias power to the lower electrode 16. The frequency of the high frequency bias power is within a range of 400 kHz to 13.56 MHz, for example, 3 MHz. The matching unit MU2 has a circuit configured to match an output impedance of the second high frequency power source LFS and the input impedance of a load side (lower electrode 16 side).

An electrostatic chuck 18 is provided on the lower electrode 16. The electrostatic chuck 18 constitutes a placing table together with the lower electrode 16 to support the wafer W. The electrostatic chuck 18 has a structure in which an electrode 20, which is a conductive film, is disposed between a pair of insulating layers or insulating sheets. The electrode 20 is electrically connected with a direct current (DC) power source 22. The electrostatic chuck 18 may attract and hold the wafer W with electrostatic force such as Coulomb force generated by DC voltage applied from the DC power source 22.

A focus ring FR is disposed on the top of the lower electrode 16 and around the electrostatic chuck 18. The focus ring FR is provided in order to enhance uniformity of the etching. The focus ring FR is made of a material such as, for example, silicon or quartz, which is appropriately selected depending on a material of a layer to be etched.

A coolant chamber 24 is formed inside the lower electrode 16. A coolant such as, for example, cooling water at a predetermined temperature is circulated and supplied from a chiller unit, which is provided outside, to the coolant chamber 24 through pipes 26a, 26b. The temperature of the wafer W placed on the electrostatic chuck 18 is controlled by controlling the temperature of the coolant circulated in this way.

Further, the plasma processing apparatus 10 is formed with a gas supply line 28. The gas supply line 28 supplies a heat transfer gas such as, for example, helium (He) gas, from a heat transfer gas supply mechanism to a gap between the top surface of the electrostatic chuck 18 and the rear surface of the wafer W.

Further, the plasma processing apparatus 10 is provided with an upper electrode 30. The upper electrode 30 is disposed above the lower electrode 16 to face the lower electrode 16. The lower electrode 16 and the upper electrode 30 are provided substantially in parallel to each other. A processing space S is defined between the upper electrode 30 and the lower electrode 16 to perform plasma etching on the wafer W.

The upper electrode 30 is supported in the upper portion of the processing container 12 through an insulating shielding member 32. The upper electrode 30 may include an electrode plate 34 and an electrode support 36. The electrode support 34 faces the processing space S and defines a plurality of gas ejection holes 34a. The electrode plate 34 may be made of a low-resistance conductor or semiconductor having a low joule heat.

The electrode support 36 detachably supports the electrode plate 34, and may be made of a conductive material such as, for example, aluminum. The electrode support 36 may have a water-cooling structure. A gas diffusion chamber 36a is formed inside the electrode support 36. A plurality of gas passage holes 36b communicating with the gas ejection holes 34a extends downwardly from the gas diffusion chamber 36a. Further, the electrode support 36 is formed with a gas inlet 36c configured to guide a processing gas to the gas diffusion chamber 36a. The gas inlet 36c is connected with a gas supply pipe 38.

Figure 2:
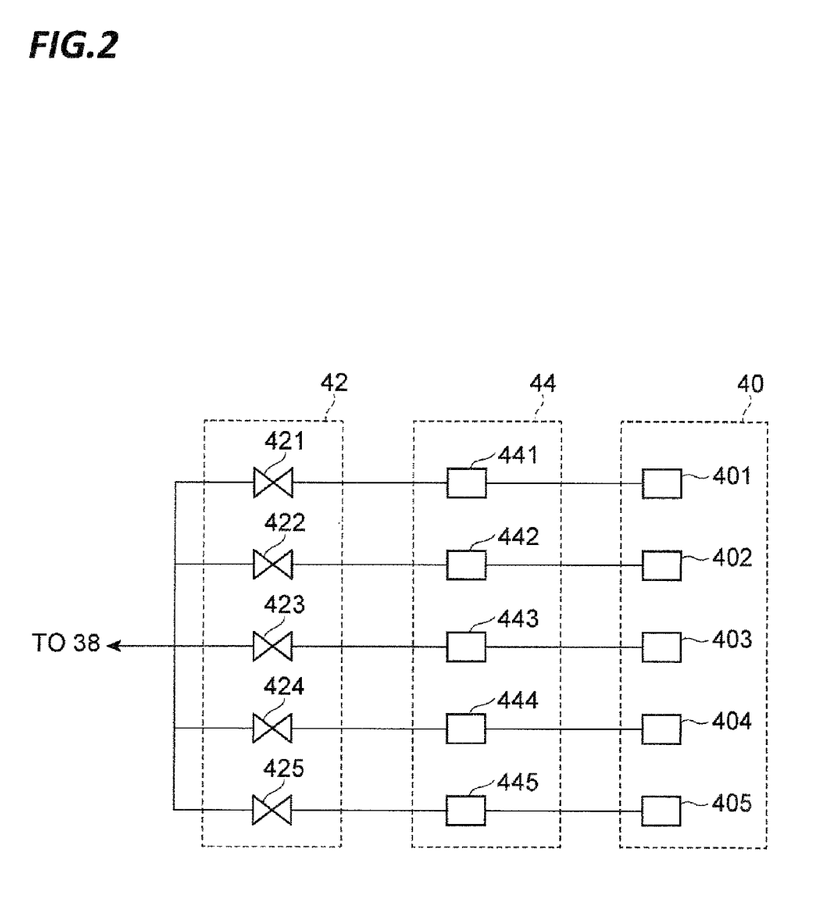
FIG. 2 is a view illustrating an exemplary valve group, an exemplary flow controller group, and an exemplary gas source group in detail.

The gas supply pipe 38 is connected with a gas source group 40 through a valve group 42 and a flow controller group 44. FIG. 2 is a view illustrating an exemplary valve group, an exemplary flow controller group, and an exemplary gas source group in detail. As illustrated in FIG. 2, the gas source group 40 includes a plurality of gas sources 401 to 405. The gas sources 401 to 405 are sources of $C_4F_6$ gas, $O_2$ gas, Ar gas, $Cl_2$ gas and HBr gas, respectively. The flow controller group 44 includes a plurality of flow controllers 441 to 445. The flow controllers 441 to 445 are connected to the gas sources 401 to 405, respectively. Each of the flow controllers 441 to 445 may be a mass flow controller. The valve group 42 includes a plurality of valves 421 to 425. The valves 421 to 425 are connected to the flow controllers 441 to 445, respectively.

In the plasma processing apparatus 10, a gas from a gas source selected from the gas sources 401 to 405 is supplied in a flow-controlled state to the gas supply pipe 38 through a corresponding flow controller and valve. The gas supplied to the gas supply pipe 38 reaches the gas diffusion chamber 36a, and is ejected to the processing space S through the gas passage holes 36b and the gas ejection holes 34a.

Further, as illustrated in FIG. 1, the plasma processing apparatus 10 may be further provided with a grounding conductor 12a. The grounding conductor 12a is a substantially cylindrical grounding conductor, and is provided to extend to a height above the height position of the upper electrode 30 from the side wall of the processing container 12.

Further, in the plasma processing apparatus 10, a deposition shield 46 is detachably provided along the inner wall of the processing container 12. Further, the deposition shield 46 is also provided on the outer periphery of the support 14. The deposition shield 46 prevents any etching byproduct (deposit) from being attached to the processing container 12, and may be constituted by coating ceramics such as, for example, $Y_2O_3$ on an aluminum material.

At a bottom side of the processing container 12, an exhaust plate 48 is provided between the support 14 and the inner wall of the processing container 12. The exhaust plate 48 may be constituted by coating ceramics such as, for example, $Y_2O_3$ on an aluminum material. The processing container 12 is formed with an exhaust port 12e below the exhaust plate 48. The exhaust port 12e is connected with an exhaust device 50 through an exhaust pipe 52. The exhaust device 50 is provided with a vacuum pump such as, for example, a turbo molecular pump, and may decompress the inside of the processing container 12 to a desired degree of vacuum. Further, a wafer W carry-in/out port 12g is formed on the side wall of the processing container 12, and the carry-in/out port 12g is able to be opened or closed by a gate valve 54.

Further, a conductive member (GND block) 56 is provided on the inner wall of the processing container 12. The conductive member 56 is attached to the inner wall of the processing container 12 to be positioned substantially at the same height as the wafer W in the height direction. The conductive member 56 is connected in a DC mode to the ground, and exhibits an effect of preventing abnormal discharge.

The plasma processing apparatus 10 may be further provided with a control unit Cnt. The control unit Cnt is a computer provided with, for example, a processor, a storage unit, an input device, and a display device, and controls each component of the plasma processing apparatus 10. In the control unit Cnt, an operator may use the input device to perform, for example, an input operation of commands in order to manage the plasma processing apparatus 10, and to cause the display device to visualize and display the operation status of the plasma processing apparatus 10. Further, the storage unit of the control unit Cnt stores a control program for controlling various processings performed in the plasma processing apparatus 10 by the processor, or a program for allowing each unit of the plasma processing apparatus 10 to perform a processing according to processing conditions, that is, a processing recipe.

The etching method of the exemplary embodiment may be performed by using the plasma processing apparatus 10. For example, the silicon oxide film is etched by exposing the wafer W to plasma of a processing gas containing $C_4F_6$ gas. Meanwhile, the processing gas is not limited to $C_4F_6$ gas, and may include any fluorocarbon-based gas. Here, the fluorocarbon-based gas is fluorocarbon gas or fluorohydrocarbon gas. Further, the processing gas may include a rare gas such as Ar gas, and oxygen gas.

Figure 3:
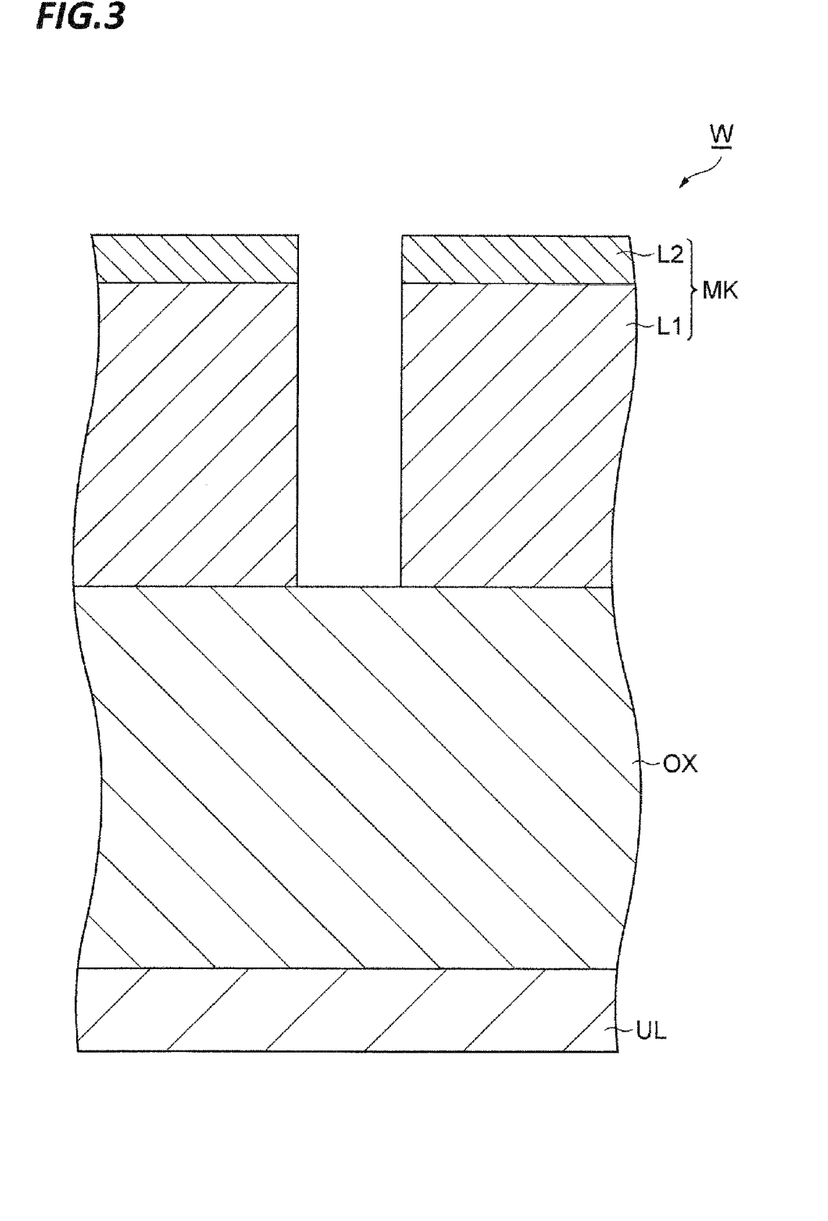
FIG. 3 is a cross-sectional view illustrating an exemplary workpiece which is an object to be processed of the etching method according to the exemplary embodiment.

FIG. 3 is a cross-sectional view illustrating an exemplary workpiece which is an object to be processed of the etching method according to the exemplary embodiment. The workpiece (hereinafter, referred to as a "wafer") W as illustrated in FIG. 3 includes a base layer UL, a silicon oxide film OX, and a mask MK. The silicon oxide film OX is formed on the base layer UL, and may have a film thickness of, for example, 2 µm.

The mask MK is formed on the silicon oxide film OX. The mask MK has a pattern to be transferred to the silicon oxide film OX. For example, in a case of forming a contact hole that penetrates the silicon oxide film OX, the mask MK has a pattern including a circular opening.

As illustrated in FIG. 3, the mask MK includes a first film L1 and a second film L2. The first film L1 is, for example, a polysilicon film. The second film L2 is a film having an etching rate which is lower than that of the first film L1, with respect to active species in the plasma of the processing gas for etching the silicon oxide film. The second film L2 is, for example, a tungsten film, a tungsten-containing polysilicon film, a carbon-containing amorphous silicon film, a TiN film, an aluminum nitride film, an aluminum oxide film, or a zirconium oxide film.

The mask MK may be prepared by, for example, the following processing. That is, the first film L1 and the second film L2 are laminated sequentially on the silicon oxide film OX. Subsequently, a mask made of silicon oxide is formed on the second film L2. Then, the second film L2 is etched by plasma of $Cl_2$ gas generated in the plasma processing apparatus 10. The etching of the second film L2 is performed, for example, by setting the power of the high frequency power source HFS to 800 W, the power of the high frequency power source LFS to 400 W, the flow rate of $Cl_2$ gas to 50 sccm, the pressure in the processing container 12 to 10 mTorr (1.333 Pa), and the temperature of the wafer to 60° C. Thereafter, when the first film L1 is a polysilicon film, the first film L1 is etched by plasma of HBr gas generated in the plasma processing apparatus 10. Accordingly, the mask MK as illustrated in FIG. 3 is obtained. Meanwhile, the preparation of the mask MK may be performed in a separate plasma processing apparatus linked with the plasma processing apparatus 10 through a vacuum transfer system.

In the etching method of the exemplary embodiment, the silicon oxide film OX is etched using the mask MK. For example, in a case of using the plasma processing apparatus 10, the silicon oxide film OX may be etched by supplying a processing gas containing $C_4F_6$ gas, $O_2$ gas and Ar gas to the processing container 12, setting the pressure in the processing container 12 to 17 mTorr (2.266 Pa), setting the temperature of the wafer W to 60° C., and generating plasma of the processing gas.

Figure 4:
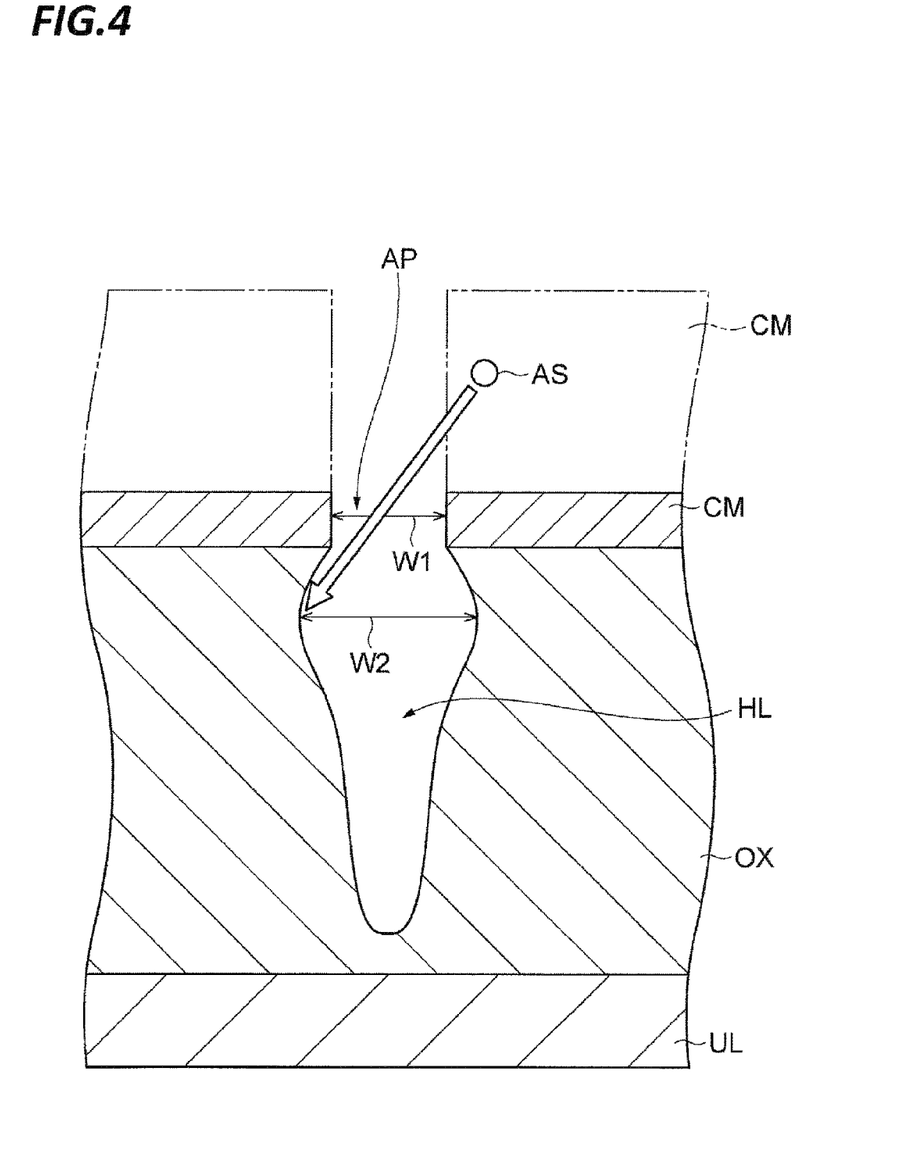
FIG. 4 is a cross-sectional view illustrating a workpiece processed in a conventional etching method of a silicon oxide film.

Hereinafter, the etching method of the exemplary embodiment will be described in detail, comparing with a conventional etching method of a silicon oxide film. FIG. 4 is a cross-sectional view illustrating a workpiece processed in a conventional etching method of a silicon oxide film. In the conventional etching method, a monolayered polysilicon film, for example, is used as a mask CM to etch a silicon oxide film OX formed on a base layer UL. In the mask CM, although the silicon oxide film OX is etched while forming a protective film on the surface of the mask CM, the film thickness of the mask CM is decreased as illustrated in FIG. 4 before the end of the etching Meanwhile, in FIG. 4, a state of the mask CM prior to the etching of the silicon oxide film OX is indicated by a two-dot chain line, and a state of the mask CM during the etching of the silicon oxide film OX is indicated by a solid line.

As illustrated in FIG. 4, when the film thickness of the mask CM is decreased, an active species AS in the plasma incident obliquely with respect to the vertical direction from an opening AP is increased. The obliquely incident active species AS collide with a site just below the mask CM, that is, an upper side wall of the silicon oxide film OX which defines a hole HL. As a result, bowing is generated in the conventional etching method. That is, a portion of the hole HL has a width W2 broader than a width W1 of the opening AP of the mask CM.

The wafer W of the exemplary embodiment has the following characteristics. That is, the first film L1 has a high etching rate with respect to the active species in the plasma of the processing gas for etching the silicon oxide film, as compared with the second film L2. However, the first film may be easily processed. Accordingly, the mask MK having a thick film thickness may be obtained when the film thickness occupied by the first film L1 is increased in the film thickness of the mask MK. Meanwhile, the second film L2 is a film which is difficult to form with a good crystallinity and in a thick film thickness, and takes time to be processed, as compared with the first film L1. However, the second film L2 has a low etching rate with respect to the active species in the plasma of the processing gas for etching the silicon oxide film. Since the mask MK of the exemplary embodiment has a laminated structure of the first film L1 which is relatively easy to process and may have an increased film thickness, and the second film L2 having a high etching resistance, the mask MK may have a resistance to the active species in the plasma and a thick film thickness.

Figure 5:
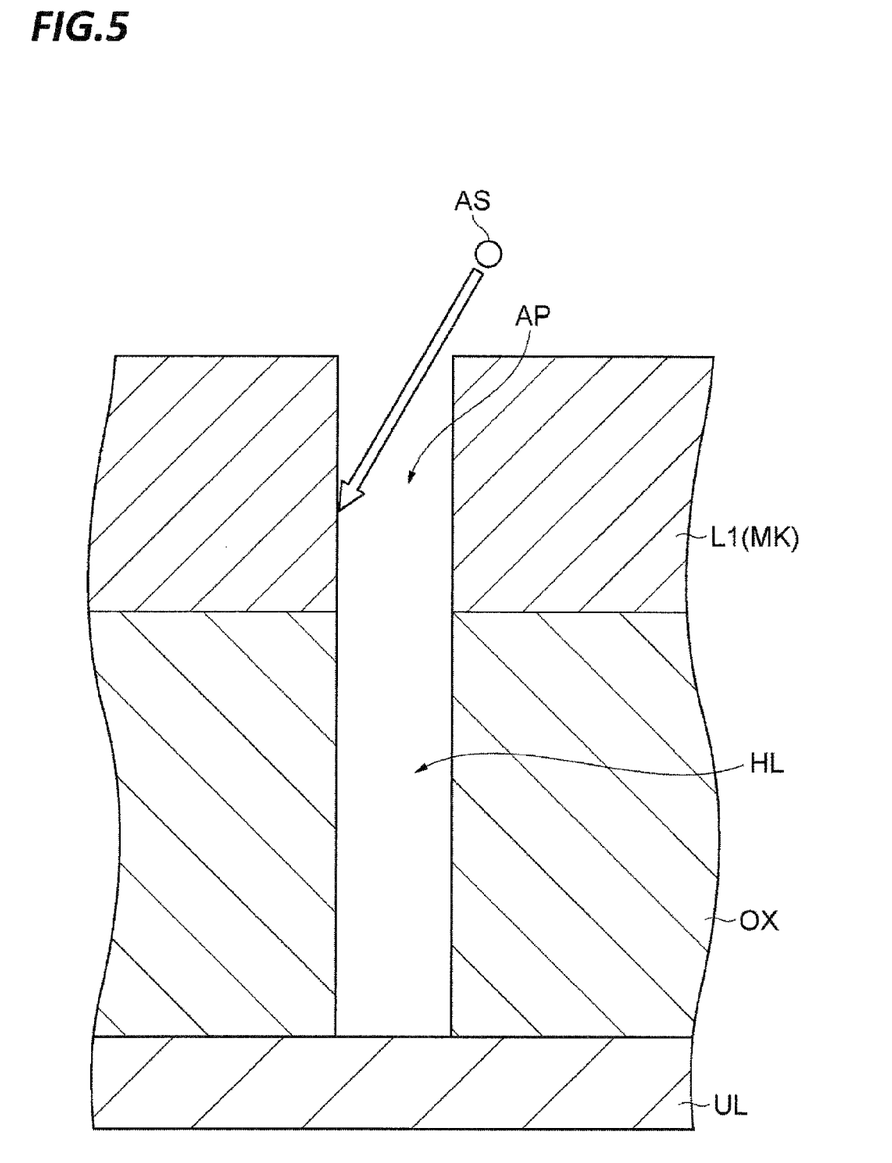
FIG. 5 is a cross-sectional view illustrating a state of a workpiece at the end of the etching of the silicon oxide film by the etching method according to the exemplary embodiment.

When the mask MK is used, the etching method of the exemplary embodiment is capable of maintaining the film thickness of the mask until the end of the etching of the silicon oxide film OX. Specifically, as illustrated in FIG. 5, even though the second film L2 is removed by etching before the end of the etching of the silicon oxide film OX, the first film L1 having a sufficient film thickness remains. As a result, as illustrated in FIG. 5, when the active species AS is incident obliquely with respect to the vertical direction, the active species AS collides with the mask MK. Therefore, the side wall of the silicon oxide film OX may be suppressed from being cut transversely. Accordingly, it is possible to reduce generation of bowing caused by ions that is incident obliquely when etching the hole.

Figure 6:
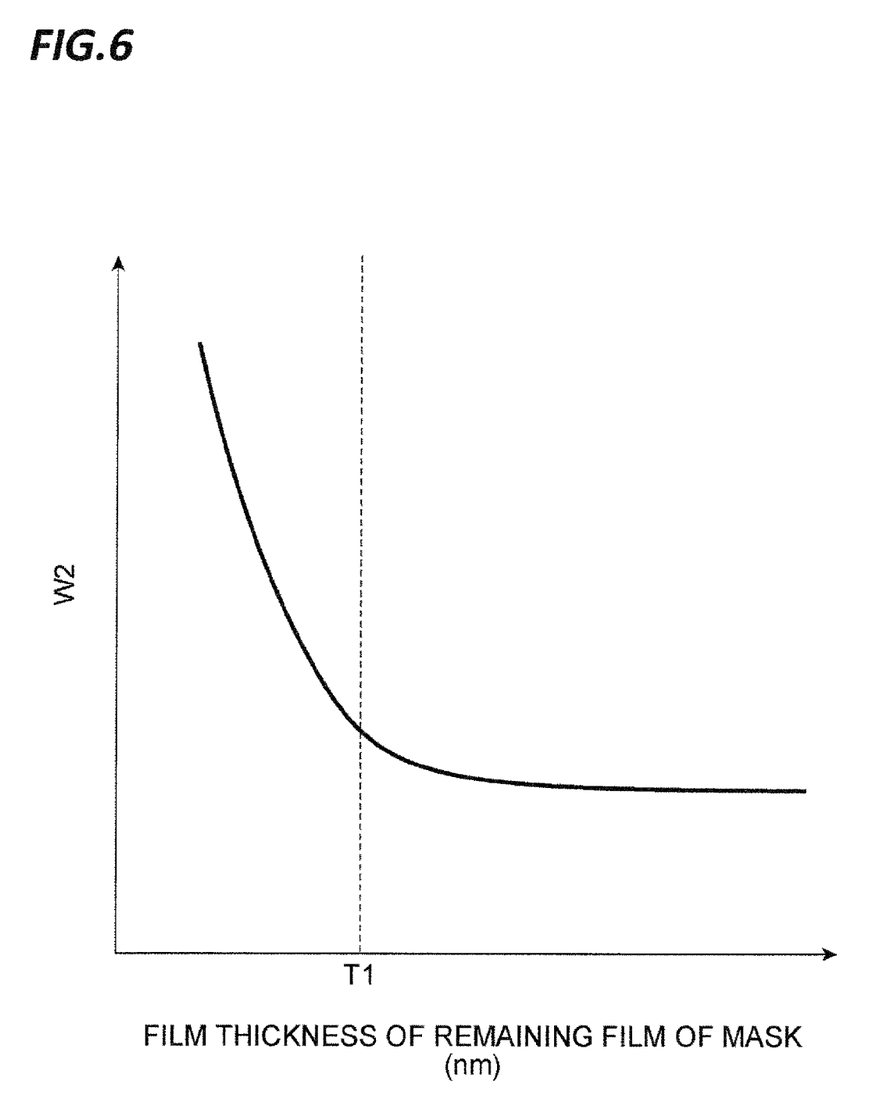
FIG. 6 is a view illustrating a relationship between a thickness of a remaining film of a mask MK and a width W2 illustrated in FIG. 4.

FIG. 6 is a view illustrating a relationship between a thickness of a remaining film of the mask MK and a width W2 illustrated in FIG. 4. In FIG. 6, the horizontal axis represents a film thickness of the remaining film of the mask at the end of the etching of the silicon oxide film OX. Further, in FIG. 6, the vertical axis represents a width W2 as illustrated in FIG. 4, that is, a quantity that reflects bowing. As illustrated in FIG. 6, when the remaining film of the mask is thin at the end of the etching of the silicon oxide film OX, the width W2 has a large value. That is, when the remaining film of the mask is thin at the end of the etching of the silicon oxide film OX, bowing is generated. Meanwhile, when the film thickness of the remaining film of the mask is equal to or greater than a film thickness T1 at the end of the etching of the silicon oxide film OX, the width W2 becomes a substantially constant quantity. Accordingly, the film thickness of the first film L1, the material of the first film L1, the film thickness of the second film L2, and the material of the second film L2 may be selected such that the film thickness of the remaining film of the mask is equal to or thicker than the film thickness T1 at the end of the etching of the silicon oxide film OX. For example, the film thickness of the first film L1, the material of the first film L1, the film thickness of the second film L2, and the material of the second film L2 may be selected such that the film thickness of the remaining film of the mask is 250 nm at the end of the etching of the silicon oxide film OX, although they vary depending on the size of the opening AP of the mask MK.

Here, assuming that the film thickness of the first film L1 is D1, the film thickness of the second film L2 is D2, the etching rate of the first film L1 is E1, the etching rate of the second film L2 is E2, and the etching time of the silicon oxide film OX is t, the film thickness Dr of the remaining film of the mask MK is expressed by the following Equations (1) and (2).

When the second film L2 remains after the elapse of the etching time t (when t≤D2/E2)

$$Dr = D1 + D2 - E2 \times t \quad (1)$$

When the second film L2 does not remain after the elapse of the etching time t (when t?D2/E2)

$$Dr = D1 + (E1/E2) \times D2 - E1 \times t \quad (2)$$

Figure 7:
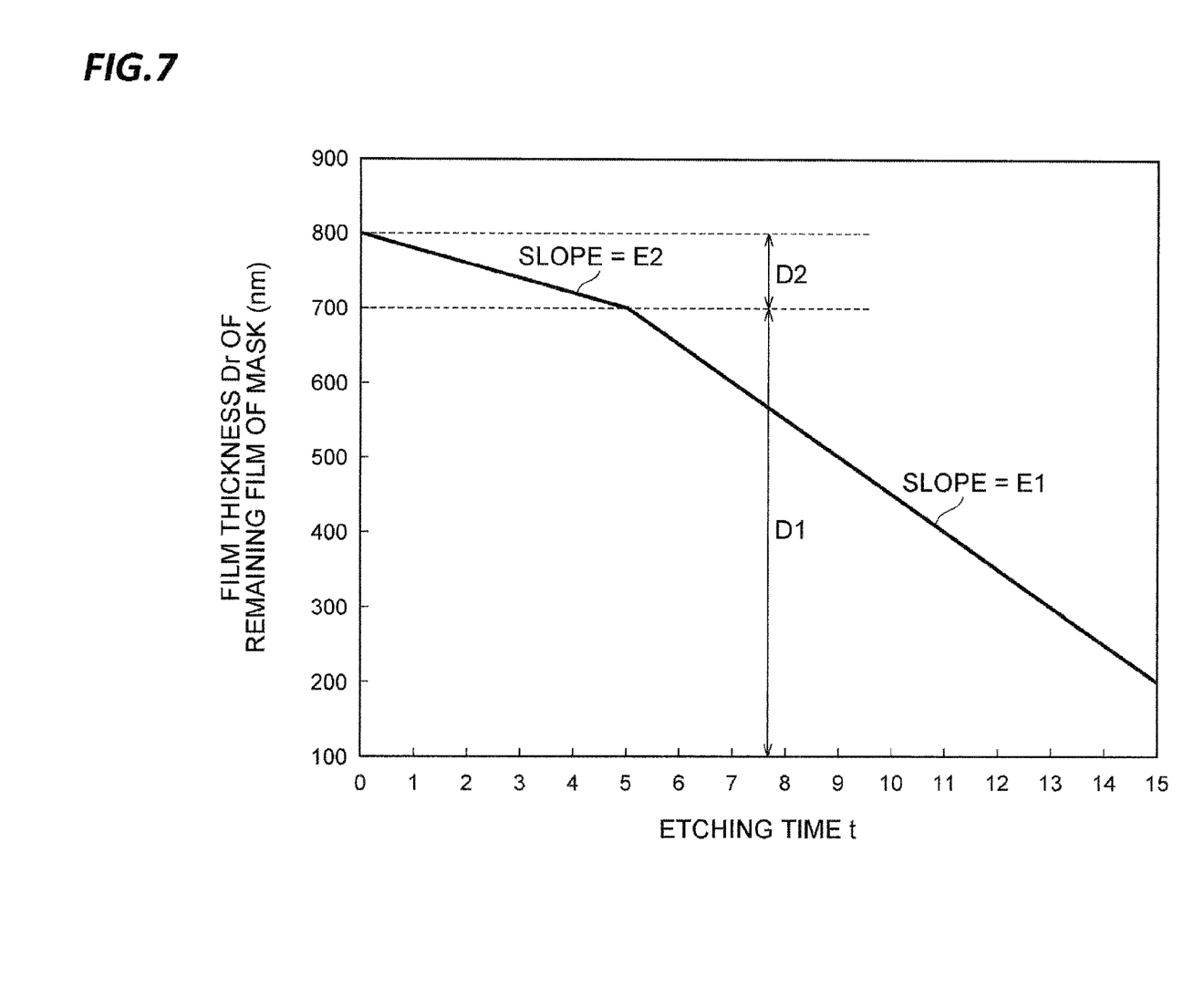
FIG. 7 is a view illustrating an exemplary relationship between an etching time of the silicon oxide film and a film thickness of the remaining film of the mask.

FIG. 7 illustrates an exemplary relationship between the etching time t of the silicon oxide film OX and the film thickness Dr of the remaining film of the mask MK based on Equations (1) and (2). In the example as illustrated in FIG. 7, E2 is equal to 20 nm/min, E1 is equal to 50 nm/min, D2 is equal to 100 nm, and D1 is equal to 700 nm. As illustrated in FIG. 7, the film thickness Dr of the remaining film of the mask MK changes over time with lapse of the etching time t of the silicon oxide film OX. Specifically, while the second film L2 remains, the film thickness Dr of the remaining film of the mask MK is decreased gradually over time due to the fact that the etching rate E2 is low. Further, after the second film L2 is cut, the film thickness Dr is decreased sharply due to the fact that the etching rate E1 is high.

Considering the temporal change of the film thickness Dr of the remaining film of the mask MK as defined by Equations (1) and (2), the film thickness of the first film L1, the material of the first film L1, the film thickness of the second film L2, and the material of the second film L2 may be determined. That is, assuming that a time required for the etching of the silicon oxide film OX is t1, and a film thickness of the remaining film of the mask required after the elapse of the time t1 is equal to or longer than T1, the following Equations (3) and (4) may be derived. And then, the film thickness of the first film L1, the material of the first film L1, the film thickness of the second film L2, and the material of the second film L2 may be selected such that the film thickness D1 of the first film L1, the film thickness D2 of the second film L2, the etching rate E1 of the first film L1, and the etching rate E2 of the second film L2 satisfy Equations (3) and (4).

When the second film L2 remains after the elapse of the etching time t1 (when t1≤D2/E2)

$$D1+D2-E2\times t1 \geq T1 \quad (3)$$

When the second film L2 does not remain after the elapse of the etching time t1 (when t1≥D2/E2)

$$D1+(E1/E2)\times D2-E1\times t1 \geq T1 \quad (4)$$

In the exemplary embodiment, the second film L2 may have a film thickness thinner than the film thickness of the first film L1. That is, in the exemplary embodiment, the mask MK in which the film thickness D2 of the second film L2 is thinner than the film thickness D1 of the first film L1 may be constituted to satisfy Equations (3) and (4). Accordingly, it is possible to reduce the film thickness of the second film L2 which may be made of a material hard to etch. In addition, after the etching of the silicon oxide film OX, it is possible to obtain a mask MK in which the film thickness of the remaining film is maintained in a predetermined film thickness level or more. For example, in an initial state, that is, in a state before the etching of the silicon oxide film OX, the first film L1 may have a film thickness of, for example, 700 nm, and the second film L2 may have a film thickness of for example, 100 nm.

Further, in the exemplary embodiment, the second film L2 may have an etching rate which is one third or less of the etching rate of the first film L1, with respect to the active species in the plasma of the processing gas for etching the silicon oxide film. According to a test performed by the present inventors, in an etching by plasma of a fluorocarbon gas, assuming that an etching rate of an undoped typical polysilicon film is 1, the etching rate of a polysilicon film containing 15 at % of carbon, the etching rate of a polysilicon film containing 20 at % of carbon, and the etching rate of a polysilicon film containing tungsten were 3/5, 2/3, and 1/3, respectively. Therefore, a tungsten film may be used as the second film L2 having an etching rate which is one third or less of the etching rate of the first film L1 with respect to the active species of the processing gas for etching the silicon oxide film.

Various exemplary embodiments have been described, but various modifications may be made without being limited to the above-described exemplary embodiments. For example, the second film L2 may have a film thickness thicker than the first film L1. Further, the first film L1 is not limited to a polysilicon film. For example, a carbon-containing amorphous silicon or an amorphous carbon may be used as the first film L1, and a tungsten film may be used as the second film L2.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of etching, comprising:
   forming a dual-layered mask by sequentially laminating a first film and a second film on a silicon oxide film formed on a substrate;
   exposing the substrate including the silicon oxide film and the dual-layered mask formed on the silicon oxide film to plasma of a processing gas to etch the silicon oxide film via the dual-layered mask to form a hole through the silicon oxide film,
   wherein the second film of the dual-layered mask is constituted by a film having an etching rate lower than that of the first film of the dual-layered mask with respect to active species in the plasma.

2. The method of claim 1, wherein the second film has a film thickness which is thinner than that of the first film.

3. The method of claim 1, wherein the first film is a polysilicon film.

4. The method of claim 3, wherein the second film has an etching rate which is one third or less of the etching rate of the first film with respect to active species in the plasma.

5. The method of claim 1, wherein the second film is a metal-containing film.

6. The method of claim 5, wherein the second film is a tungsten film.

7. The method of claim 1, wherein the second film has a thickness thicker than that of the first film.

8. The method of claim 1, wherein the first film is any one of a carbon-containing amorphous silicon and an amorphous carbon.

9. The method of claim 1, wherein the thickness of the remaining film of the dual-layered mask is expressed by a following equation when the second film remains after an elapse of an etching time:

$$Dr=D1+D2-E2\times t,$$

wherein Dr is the thickness of the remaining film of the dual-layered mask, D1 is the thickness of the first film, D2 is the thickness of the second film, E2 is the etching rate of the second film, and 't' is the etching time of the silicon oxide film.

10. The method of claim 9, wherein the thickness of the remaining film of the dual-layered mask is expressed by a following equation when the second film does not remain after the elapse of the etching time:

$$Dr=D1+(E1/E2)\times D2-E1\times t,$$

wherein Dr is the thickness of the remaining film of the dual-layered mask, D1 is the thickness of the first film, E1 is the etching rate of the first film, E2 is the etching rate of the second film, D2 is the thickness of the second film, and 't' is the etching time of the silicon oxide film.

11. The method of claim 10, wherein the thickness of the first film, a material of the first film, the thickness of the second film, and a material of the second film are determined by considering a temporal change of the thickness (Dr) of the remaining film of the dual-layered mask.

12. The method of claim 11, wherein the thickness of the first film, the material of the first film, the thickness of the second film, and the material of the second film are selected such that a following equation is satisfied when the second film does not remain after an elapse of a time required for the etching of the silicon oxide film:

$$D1+(E1/E2)\times D2-E1\times t1 \geq T1,$$

wherein D1 is the thickness of the first film, D2 is the thickness of the second film, E1 is the etching rate of the first film, E2 is the etching rate of the second film, 't1' is the time required for the etching of the silicon oxide film, and T1 is the predetermined thickness of the remaining film of the mask required after an elapse of the time 't1'.

13. The method of claim 9, wherein the thickness of the first film, a material of the first film, the thickness of the second film, and a material of the second film are determined by considering a temporal change of the thickness (Dr) of the remaining film of the dual-layered mask.

14. The method of claim 13, wherein the thickness of the first film, the material of the first film, the thickness of the second film, and the material of the second film are selected such that a following equation is satisfied when the second film remains after an elapse of a time required for the etching of the silicon oxide film:

$$D1+D2-E2 \times t1 \geq T1,$$

wherein D1 is the thickness of the first film, D2 is the thickness of the second film, E2 is the etching rate of the second film, and 't1' is the time required for the etching of the silicon oxide film, and T1 is the predetermined thickness of the remaining film of the dual-layered mask required after an elapse of the time 't1'.

* * * * *